(12) United States Patent
Godet et al.

(10) Patent No.: US 9,136,096 B2
(45) Date of Patent: Sep. 15, 2015

(54) THREE DIMENSIONAL METAL DEPOSITION TECHNIQUE

(75) Inventors: Ludovic Godet, Boston, MA (US); Adjin Sarajlic, Bedford, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 398 days.

(21) Appl. No.: 13/560,664

(22) Filed: Jul. 27, 2012

(65) Prior Publication Data

US 2014/0027274 A1  Jan. 30, 2014

(51) Int. Cl.
| | |
|---|---|
| C23C 14/24 | (2006.01) |
| H01J 37/32 | (2006.01) |
| H01J 37/34 | (2006.01) |
| C23C 14/34 | (2006.01) |
| C23C 14/04 | (2006.01) |

(52) U.S. Cl.
CPC ......... *H01J 37/32422* (2013.01); *C23C 14/046* (2013.01); *C23C 14/345* (2013.01); *C23C 14/3407* (2013.01); *H01J 37/32357* (2013.01); *H01J 37/32403* (2013.01); *H01J 37/32623* (2013.01); *H01J 37/32633* (2013.01); *H01J 37/32642* (2013.01); *H01J 37/3414* (2013.01); *H01J 37/3417* (2013.01); *H01J 37/3467* (2013.01); *H01J 2237/08* (2013.01); *H01J 2237/31701* (2013.01)

(58) Field of Classification Search
CPC combination set(s) only.
See application file for complete search history.

(56) References Cited

U.S. PATENT DOCUMENTS

| | | | |
|---|---|---|---|
| 3,895,602 A * | 7/1975 | Bobenrieth | 118/726 |
| 4,716,340 A * | 12/1987 | Lee et al. | 315/111.41 |
| 5,885,425 A | 3/1999 | Hsieh et al. | |
| 6,337,001 B1 * | 1/2002 | Haag et al. | 204/192.2 |
| 6,342,133 B2 | 1/2002 | D'Couto et al. | |
| 6,444,105 B1 | 9/2002 | Lai et al. | |
| 6,497,796 B1 | 12/2002 | Ashtiani et al. | |
| 6,541,371 B1 | 4/2003 | Ashtiani et al. | |
| 7,901,545 B2 | 3/2011 | Cerio, Jr. et al. | |
| 2010/0252531 A1 | 10/2010 | Godet et al. | |
| 2010/0255683 A1 | 10/2010 | Godet et al. | |
| 2011/0186749 A1 | 8/2011 | Godet et al. | |

OTHER PUBLICATIONS

International Search Report and Written Opinion mailed Oct. 7, 2013 for PCT/US2013/051943 filed Jul. 25, 2013.

* cited by examiner

*Primary Examiner* — Jason M Berman

(57) ABSTRACT

A plasma processing apparatus is disclosed. The plasma processing apparatus includes a source configured to generate a plasma in a process chamber having a plasma sheath adjacent to the front surface of a workpiece, and a plasma sheath modifier. The plasma sheath modifier controls a shape of a boundary between the plasma and the plasma sheath so a portion of the shape of the boundary is not parallel to a plane defined by a front surface of the workpiece facing the plasma. A metal target is affixed to the back surface of the plasma sheath modifier so as to be electrically insulated from the plasma sheath modifier and is electrically biased such that ions exiting the plasma and passing through an aperture in the plasma sheath modifier are attracted toward the metal target. These ions cause sputtering of the metal target, allowing three dimensional metal deposition of the workpiece.

20 Claims, 7 Drawing Sheets

THREE DIMENSIONAL METAL DEPOSITION TECHNIQUE

FIELD

This disclosure relates to plasma processing, and more particularly to a plasma processing apparatus for metal deposition.

BACKGROUND

A plasma processing apparatus generates a plasma in a process chamber for treating a workpiece supported by a platen in the process chamber. A plasma processing apparatus may include, but not be limited to, doping systems, etching systems, and deposition systems. The plasma is generally a quasi-neutral collection of ions (usually having a positive charge) and electrons (having a negative charge). The plasma has an electric field of about 0 volts per centimeter in the bulk of the plasma. In some plasma processing apparatus, ions from the plasma are attracted towards a workpiece. In a plasma doping apparatus, ions may be attracted with sufficient energy to be implanted into the physical structure of the workpiece, e.g., a semiconductor substrate in one instance.

The plasma is bounded by a region proximate the workpiece generally referred to as a plasma sheath. The plasma sheath is a region that has fewer electrons than the plasma. The light emission from this plasma sheath is less intense than the plasma since fewer electrons are present and hence few excitation-relaxation collisions occur. Hence, the plasma sheath is sometimes referred to as "dark space."

Turning to FIG. 1, a cross sectional view of portions of a known plasma processing apparatus is illustrated where a plasma 140 has a plasma sheath 142 adjacent to a front surface of a workpiece 138 to be treated. The front surface of the workpiece 138 defines a plane 151, and the workpiece 138 is supported by a platen 134. The boundary 141 between the plasma 140 and the plasma sheath 142 is parallel to the plane 151. Ions 102 from the plasma 140 may be attracted across the plasma sheath 142 towards the workpiece 138. Accordingly, the ions 102 that are accelerated towards the workpiece 138 generally strike the workpiece 138 at about a 0° angle of incidence relative to the plane 151 (e.g., perpendicular to the plane 151). There can be a small angular spread of the angle of incidence of less than about 3°. In addition, by controlling plasma process parameters such as gas pressure within a process chamber, the angular spread may be increased up to about 5°.

A drawback with conventional plasma processing is the lack of angular spread control of the ions 102. As structures on the workpiece become smaller and as three dimensional structures become more common (e.g., trench capacitors, vertical channel transistors such as FinFETs) it would be beneficial to have greater angle control. For example, a trench 144 having an exaggerated size for clarity of illustration is shown in FIG. 1. With ions 102 being directed at about a 0° angle of incidence or an even angular spread up to 5°, it can be difficult to uniformly treat the sidewalls 147 of the trench 144.

In addition, this system can be used for deposition of dopants, such as phosphorus, however, it is ineffective for metal deposition. Accordingly, there is a need for a plasma processing apparatus which overcomes the above-described inadequacies and shortcomings.

SUMMARY

A plasma processing apparatus and method are disclosed. The plasma processing apparatus includes a process chamber, a platen for supporting a workpiece, a source configured to generate a plasma in the process chamber having a plasma sheath adjacent to the front surface of the workpiece, and a plasma sheath modifier. The plasma sheath modifier is configured to control a shape of a boundary between the plasma and the plasma sheath so a portion of the shape of the boundary is not parallel to a plane defined by a front surface of the workpiece facing the plasma. A metal target is affixed to the back surface of the plasma sheath modifier so as to be electrically insulated from the plasma sheath modifier and is electrically biased such that ions exiting the plasma and passing through an aperture in the plasma sheath modifier are attracted toward the metal target. These ions cause sputtering of the metal target, allowing three dimensional metal deposition of the workpiece.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
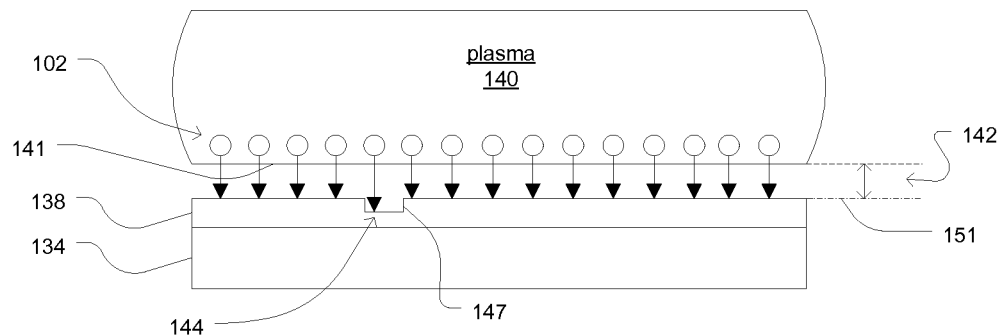
FIG. 1 is a simplified block diagram of a conventional plasma processing apparatus consistent with the prior art.
Figure 2:
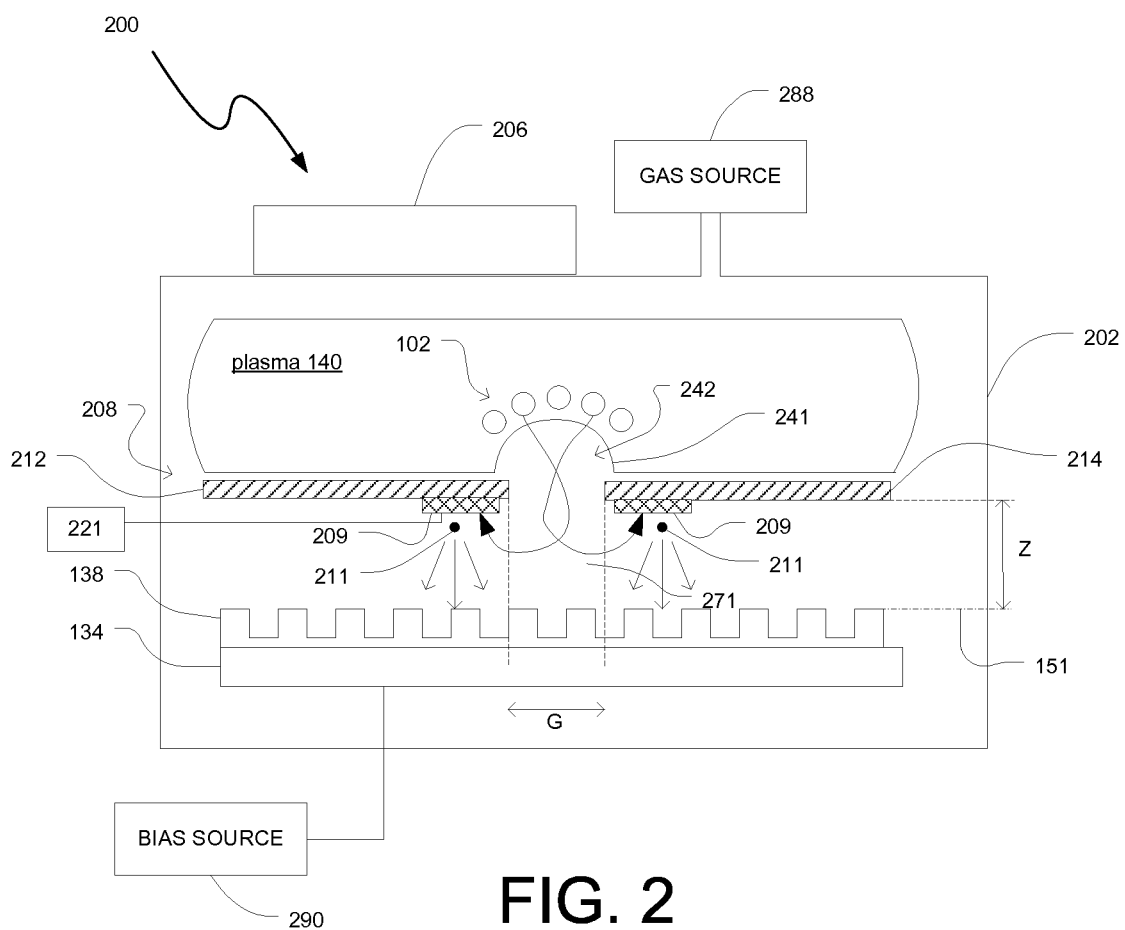
FIG. 2 is a block diagram of a plasma processing apparatus consistent with an embodiment of the disclosure.
Figure 7:
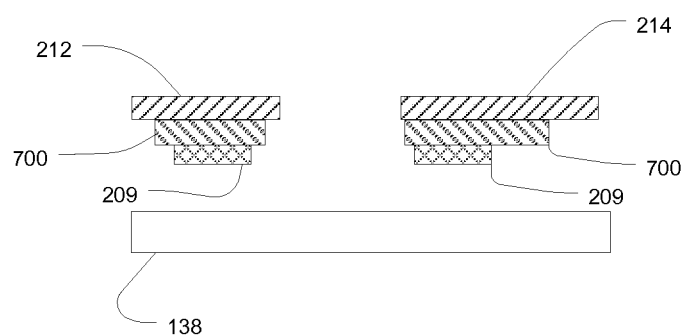
FIG. 7 shows a block diagram of the plasma sheath modifier and metal target according to another embodiment.

FIG. 2 is a block diagram of one plasma processing apparatus 200 having a plasma sheath modifier 208 and a metal target 209 electrically insulated from the plasma sheath modifier consistent with an embodiment of the disclosure. The plasma sheath modifier 208 is configured to modify an electric field within the plasma sheath 242 to control a shape of a boundary 241 between the plasma 140 and the plasma sheath 242. The plasma sheath modifier 208 may be an insulator, a conductor, or a semiconductor material. If the plasma sheath modifier 208 is an insulating material, the metal target 209 may be affixed directly to the plasma sheath modifier 208, as seen in FIG. 2. In other embodiments, the plasma sheath modifier 208 may be a semiconducting or conducting material. In this case, the metal target 209 may be affixed to the plasma sheath modifier 208 and be electrically isolated from the plasma sheath modifier 208, such as by a layer of insulating material 700 interposed between the metal target 209 and the plasma sheath modifier 208, as shown in FIG. 7. Thus, the term "affixed" referred to direct contact between the metal target 209 and the plasma sheath modifier 209, or indirect contact where a layer of insulating material 700 is disposed between the plasma sheath modifier 208 and the metal target 209.

Returning to FIG. 2, the metal target 209 may be electrically biased. Accordingly, ions 102 that are attracted from the plasma 140 across the plasma sheath 242 may strike the metal target 209 at a specific range of incident angles. These ions striking the metal target 209 cause the target to sputter, thereby depositing the metal particles 211 at a wide range of incident angles.

The plasma processing apparatus 200 may be further described herein as a plasma doping apparatus. However, the plasma processing apparatus 200 may also include, but not be limited to, etching and deposition systems. Furthermore, a plasma doping system can perform many differing material modification processes on a treated workpiece. One such process includes doping a workpiece, such as a semiconductor substrate, with a desired dopant.

The plasma processing apparatus 200 may include a process chamber 202, a platen 134, a source 206, and the plasma sheath modifier 208. The platen 134 is positioned in the process chamber 202 for supporting the workpiece 138. The workpiece 138 may include, but not be limited to, a semiconductor wafer, flat panel, solar panel, and polymer substrate. The semiconductor wafer may have a disk shape with a diameter of 300 or 450 millimeters (mm) in one embodiment. The source 206 is configured to generate the plasma 140 in the process chamber 202 as is known in the art. In the embodiment of FIG. 2, the plasma sheath modifier 208 may be made of an insulating material and includes a pair of modifiers 212 and 214 defining a gap there between having a horizontal spacing (G). In other embodiments, the plasma sheath modifier 208 may include only one modifier having an aperture. As stated above, in other embodiments, the plasma sheath modifier 208 may be a semiconducting or conducting material. Although FIG. 2 illustrates a plasma sheath modifier 208 that is an insulator where the metal target 209 is attached directly to the modifiers 212 and 214, it is understood that the disclosure is not limited to only insulating plasma sheath modifiers 208. FIG. 7 illustrates a mechanism by which a metal target 209 may be used with a semiconducting or conducting plasma sheath modifier 208.

The pair of modifiers 212 and 214 may be a pair of sheets having a thin, flat shape. In other embodiments, the pair of modifiers 212 and 214 may be other shapes such as tube shaped, wedge shaped, and/or have a beveled edge proximate the gap.

In one embodiment, the horizontal spacing of the gap defined by the pair of modifiers 212 and 214 may be about 6.0 millimeters (mm). The pair of modifiers 212 and 214 may also be positioned a vertical spacing (Z) above the plane 151 defined by the front surface of the workpiece 138. In one embodiment, the vertical spacing (Z) may be about 3.0 mm.

A metal target 209 is affixed on the back surface of the modifiers 212 and 214, in proximity to the gap. If the modifiers 212 and 214 are insulators, the metal target 209 may be deposited directly on the modifiers 212 and 214. Alternatively, the metal target 209 may be bonded, applied as a coating or mechanically attached. The metal target 209 may vary in thickness from a few microns to several millimeters. The thickness of the target 209 may determine its useful life. If the modifiers 212 and 214 are semiconducting or conducting material, an insulating layer 700 is disposed on the modifiers 212 and 214 as seen in FIG. 7. The metal target 209 is then applied to the insulating material 700 using any of the methods described above.

The metal target 209 may be any suitable metal of compound semiconductor, including but not limited to Cu, Al, W, Ti, Hf, Ta, Co, Pd, Pt, Ru, Zn, ZnTe, and CuTe, and may be selected based on the required deposition layer composition.

The metal target 209 may be textured to control the sputtering process efficiency. These textures include pyramid, porous, wave or any suitable shape.

In some embodiments, the metal target 209 is disposed about the entire perimeter of the gap or aperture. In other embodiments, the metal target 209 is disposed about only part of the perimeter or aperture. The metal target 209 may be electrically biased using a power supply 221 so as to attract ions 102 passing through the gap. These ions 102 strike the metal target 209, causing it to sputter. These sputtered metal particles 211 are then attracted toward the platen 134, and deposited at a wide range of angles on the workpiece 138. These metal particles 211 may be ions or may be neutrals.

Figure 8A:
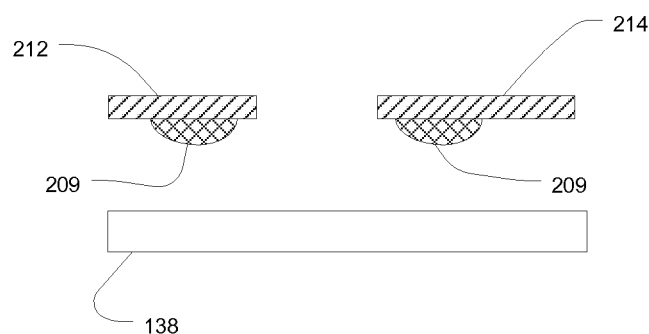
FIGS. 8A-8B show alternate shapes of the metal target according to other embodiments.
Figure 8B:
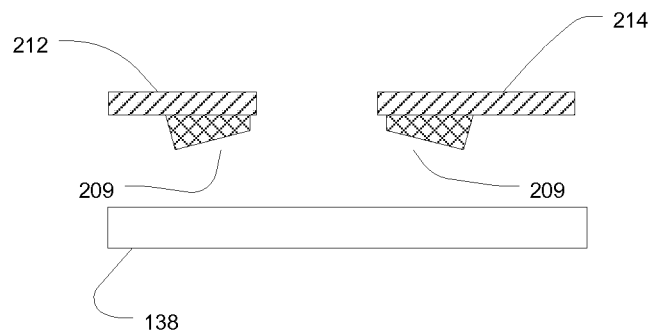

While FIG. 2 shows the metal target 209 as a flat piece of metal, the disclosure is not limited to this shape. For example, the shape of the metal target 209 may be optimized for improved sputtering yield. For example, the metal target 209 may be a curved, angled, or curvilinear shape, such as is shown in FIGS. 8A-B. Thus, shapes which are non-linear or curved may be used. In addition, the shape of the metal target 209 may be such that the surface of the metal target closest to the workpiece 138 is not parallel to the front surface of the workpiece.

In operation, a gas source 288 supplies an ionizable gas to the process chamber 202. Examples of an ionizable gas include, but are not limited to, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $CF_4$, $AsF_5$, $PF_3$, and $PF_5$. HCl, $Cl_2$, chlorine based molecules and other compounds that cause a chemical reaction with the metal target 209 in addition to the sputtering effect may also be used. Additionally, mixtures of gasses including $N_2$, He, $H_2$ and Ar may be used. The source 206 may generate the plasma 140 by exciting and ionizing the gas provided to the process chamber 202. Ions 102 may be attracted from the plasma 140 across the plasma sheath 242 by different mechanisms. In the embodiment of FIG. 2, the bias source 221 is configured to negatively bias the metal target 138 to attract ions 102 from the plasma 140 across the plasma sheath 242. The bias source 221 may be a DC power supply to provide a DC voltage bias signal or an RF power supply to provide an RF bias signal. Furthermore, the bias source 221 may be a constant voltage output or may be pulsed. This operation may be carried out at room temperature of at an elevated temperature, as desired.

Advantageously, the plasma sheath modifier 208 modifies the electric field within the plasma sheath 242 to control a shape of the boundary 241 between the plasma 140 and the plasma sheath 242. In the embodiment of FIG. 2, the plasma sheath modifier 208 includes a pair of modifiers 212 and 214, which are insulators and may be fabricated of quartz, alumina, boron nitride, glass, silicon nitride, etc. In other embodiments, such as FIG. 7, semiconducting or conducting material may be used for the modifiers 212 and 214. In these embodiments, the semiconductor materials may be fabricated of silicon, doped silicon, silicon carbide and other suitable materials.

Returning to FIG. 2, the boundary 241 between the plasma 140 and the plasma sheath 242 may have a convex shape relative to the plane 151. When the bias source 221 biases the metal target 209, ions 102 are attracted across the plasma sheath 242 through the gap between the modifiers 212 and 214 at a predetermined range of incident angles. Depending on a number of factors including, but not limited to, the horizontal spacing (G) between the modifiers 212 and 214, the vertical spacing (Z) of the modifiers above the plane 151, the dielectric constant of the modifiers 212 and 214, the voltage of the bias source 221, and other plasma process parameters, the ions 102 may strike the metal target 209 at a predetermined range of incident angles.

The ions 102 striking the metal target 209 cause metal particles 211 to sputter from the metal target 209. Hence, the angle at which the ions 102 strike the metal target 209 may determine the angle at which the metal particles 211 sputter toward the workpiece 138. By varying the angle at which the ions 102 strike the metal target 209, small three dimensional structures on the workpiece 138 may be treated uniformly by the metal ions 102. In addition, by varying the angle at which the ions 102 strike the metal target 209, the sputtering rate may also be controlled.

Figure 3:
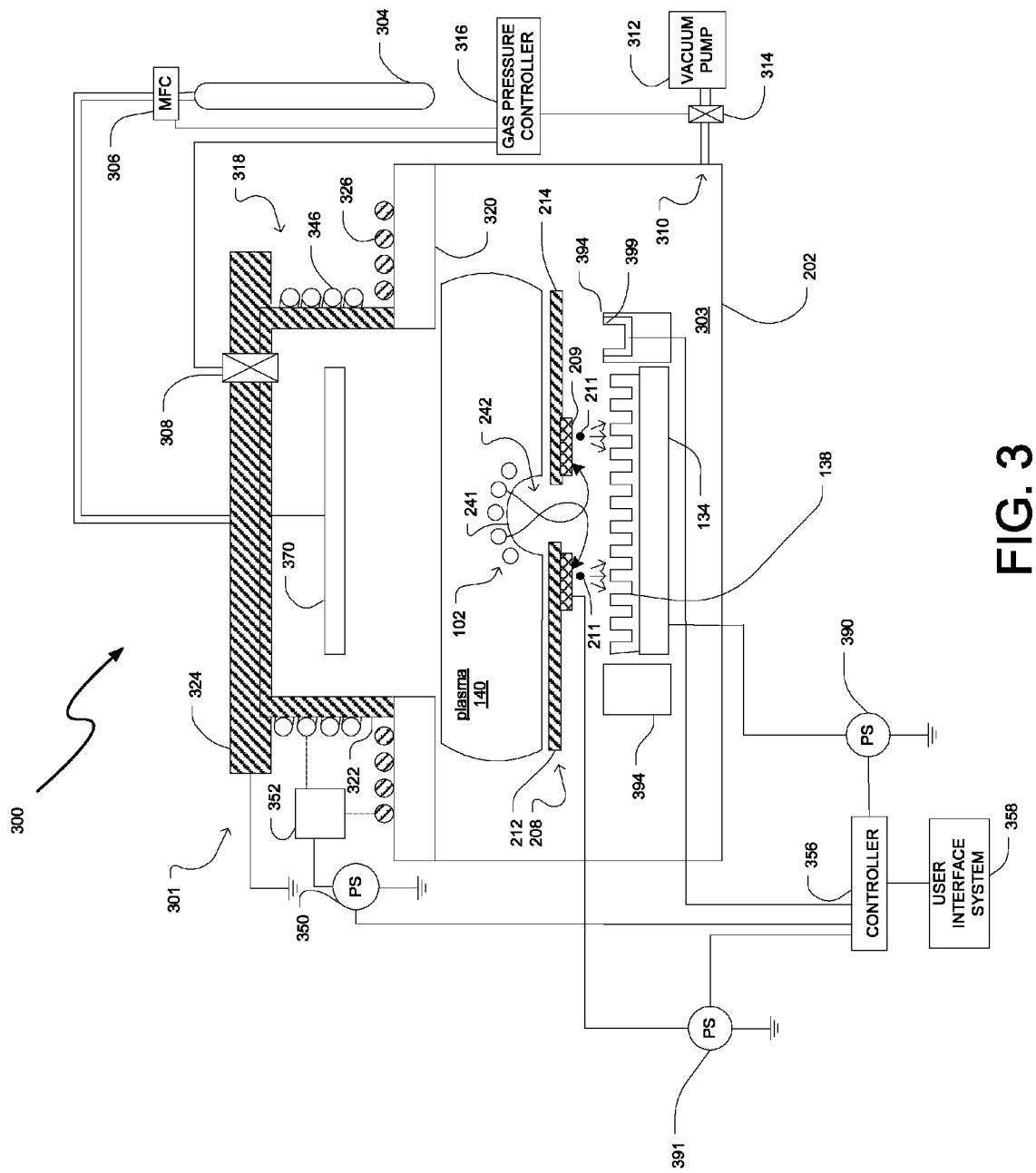
FIG. 3 is a block diagram of a plasma doping apparatus consistent with an embodiment of the disclosure.

Turning to FIG. 3, a block diagram of one exemplary plasma doping apparatus 300 is illustrated. Consistent with the apparatus of FIG. 2, the plasma doping apparatus 300 has the pair of modifiers 212 and 214 to control a shape of the boundary 241 between the plasma 140 and the plasma sheath 242.

The pair of modifiers 212 and 214 defines a gap or aperture therebetween. One or more metal targets 209 are disposed proximate to the gap or aperture. The one or more metal targets 209 may be electrically coupled to metal target power supply 391. Metal target power supply 391 may provide a constant voltage or a pulsed voltage, as desired.

The plasma doping apparatus 300 includes a process chamber 202 defining an enclosed volume 303. A gas source 304 provides a primary dopant gas to the enclosed volume 303 of the process chamber 302 through the mass flow controller 306. A gas baffle 370 may be positioned in the process chamber 202 to deflect the flow of gas from the gas source 304. A pressure gauge 308 measures the pressure inside the process chamber 202. A vacuum pump 312 evacuates exhausts from the process chamber 202 through an exhaust port 310. An exhaust valve 314 controls the exhaust conductance through the exhaust port 310.

The plasma doping apparatus 300 may further includes a gas pressure controller 316 that is electrically connected to the mass flow controller 306, the pressure gauge 308, and the exhaust valve 314. The gas pressure controller 316 may be configured to maintain a desired pressure in the process chamber 202 by controlling either the exhaust conductance with the exhaust valve 314 or a process gas flow rate with the mass flow controller 306 in a feedback loop that is responsive to the pressure gauge 308.

The process chamber 202 may have a chamber top 318 that includes a first section 320 formed of a dielectric material that extends in a generally horizontal direction. The chamber top 318 also includes a second section 322 formed of a dielectric material that extends a height from the first section 320 in a generally vertical direction. The chamber top 318 further includes a lid 324 formed of an electrically and thermally conductive material that extends across the second section 322 in a horizontal direction.

The plasma doping apparatus further includes a source 301 configured to generate a plasma 140 within the process chamber 202. The source 301 may include a RF source 350 such as a power supply to supply RF power to either one or both of the planar antenna 326 and the helical antenna 346 to generate the plasma 140. The RF source 350 may be coupled to the antennas 326, 346 by an impedance matching network 352 that matches the output impedance of the RF source 350 to the impedance of the RF antennas 326, 346 in order to maximize the power transferred from the RF source 350 to the RF antennas 326, 346.

The plasma doping apparatus may also include a bias power supply 390 electrically coupled to the platen 134. The plasma doping system may further include a controller 356 and a user interface system 358. The controller 356 can be or include a general-purpose computer or network of general-purpose computers that may be programmed to perform desired input/output functions. The controller 356 may also include communication devices, data storage devices, and software. The user interface system 358 may include devices such as touch screens, keyboards, user pointing devices, displays, printers, etc. to allow a user to input commands and/or data and/or to monitor the plasma doping apparatus via the controller 356. A shield ring 394 may be disposed around the platen 134 to improve the uniformity of implanted ion distribution near the edge of the workpiece 138. One or more Faraday sensors such as Faraday cup 399 may also be positioned in the shield ring 394 to sense ion beam current.

In operation, the gas source 304 supplies a primary dopant gas containing a desired dopant for implantation into the workpiece 138. The source 301 is configured to generate the plasma 140 within the process chamber 302. The source 301 may be controlled by the controller 356. To generate the plasma 140, the RF source 350 resonates RF currents in at least one of the RF antennas 326, 346 to produce an oscillating magnetic field. The oscillating magnetic field induces RF currents into the process chamber 202. The RF currents in the process chamber 202 excite and ionize the primary dopant gas to generate the plasma 140.

In one embodiment, the metal target power supply 391 is negatively biased, and the bias power supply 390 is maintained at ground potential. The ions 102 from the plasma 140 are accelerated toward the metal target 209. By varying the gap width, the relative vertical positions of the modifiers 212 and 214, the vertical distance between the modifiers 212 and 214 and the workpiece 138, and the voltage of metal target power supply 391, the incident angle of the ions 102 exiting the plasma 140 can be tuned. These ions 102 strike the metal targets 209 and cause it to sputter and generate metal particles 211 which are emitted toward the workpiece 138 at a wide range of angles. These metal particles 211 are then deposited or implanted in the three dimensional structures of the workpiece 138. The metal target 209 may be biased at a voltage between −100V and −20 kV. In some embodiments, the bias applied to the metal target 209 may vary during the sputtering process. For example, the bias voltage may initially be −0.5 kV which creates sputtered metal particles 211 having a certain energy. As the workpiece 138 is coated, the bias voltage may approach −2 kV, causing metal particles 211 in subsequent passes to be projected toward the workpiece 138 with increasing energy.

By optimizing the angular distribution of ions 102, the trajectories of the metal particles 211 can be optimized to obtain adequate sidewall coverage. Furthermore, the sputtering yield is dependent on the incident ion angle and metal target temperature. For example a 60° incident angle may have three times the sputtering yield of a 10° incident angle. By utilizing multiple incident angles in parallel, for example, from 0° to 60°, a variety of sputtered metal particles 211 with multiple angles may be generated.

In another embodiment, the bias power supply 390 may be negatively biased. This negative bias may be less negative than the voltage applied to the metal targets 209, so that the ions 102 are more attracted to the metal targets 209. For example, in one embodiment, the metal target 209 may be biased at −2 kV, while the workpiece 138 is biased at −1 kV. In this case, the ions 102 exiting the plasma 140 are accelerated toward the workpiece 138 and the metal target 209 at the same time. Therefore, in addition to the parameters listed above, the interaction between the ions 102 and the electrical fields created by the metal targets 209 and the workpiece 138 will affect the angles at which the ions 102 strike the metal targets 209.

Figure 9:
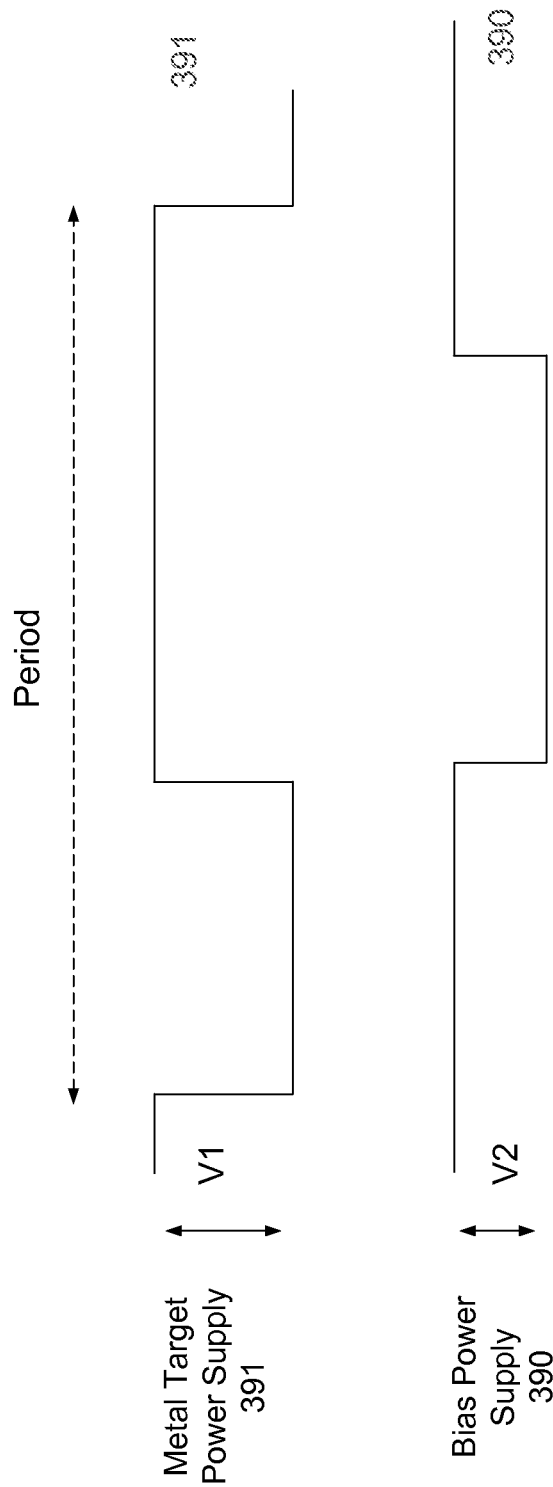
FIG. 9 shows a representative timing diagram.

In another embodiment, the metal target power supply 391 and the bias power supply 390 may provide time varying outputs, such as pulses. These pulses can be synchronized or coordinated to produce the desire behavior. For example, in one embodiment, the metal target power supply 391 and the bias power supply 390 may create negative voltage pulses simultaneously. In other embodiments, one of the power supplies provides a pulsed voltage output. Sometime after the start of this pulsed voltage output, the other power supply provides a pulsed voltage output. In some embodiments, the second power supply may output the pulsed output at the end of the first pulsed output. FIG. 9 shows a representative timing diagram showing the relationship between the metal target power supply 391 and the bias power supply 390. In one embodiment, the metal target power supply 391 generates pulses at a pulse frequency of about 5 kHz and each pulse has a duration of between 25 to 100 us. The bias power supply 390 also generates pulses having a duration of between 25 to 100 us. In FIG. 9, these pulses are coordinated such that the bias voltage pulse follows the metal target pulse. Thus, ions 102 are attracted first to the metal target 209. As metal particles 211 are sputtered, the bias voltage is pulsed, drawing those metal particles 211 toward the workpiece 138. In another embodiment, the metal target bias could be continuous DC voltage, while the bias voltage is pulsed.

The frequency of the pulsed platen signal and/or the duty cycle of the pulses may be selected to provide a desired sputter rate. The amplitude of the pulsed platen signal may be selected to provide a desired energy.

Figure 4:
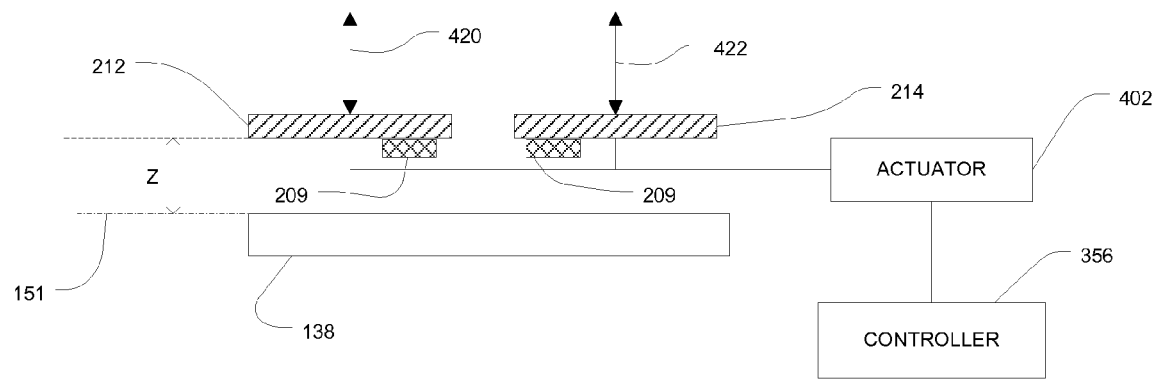
FIG. 4 is a block diagram of a system to control a vertical spacing between a pair of modifiers and a workpiece.

In some embodiments, such as shown in FIG. 4, the vertical spacing (Z) between plasma sheath modifier and the plane 151 defined by the front surface of the workpiece 138 may be adjusted. An actuator 402 may be mechanically coupled to the pair of modifiers 212 and 214 to drive the modifiers 212 and 214 in a vertical direction, as indicated by lines 420 and 422, respectively, relative to the plane 151. The Z position of the pair of modifiers 212 and 214 relative to the plane 151, and also relative to each other, influences the shape of the boundary between the plasma and the plasma sheath and also the trajectories of the ions striking the workpiece 138 or metal targets 209. This actuator 402 may be controlled by a controller, such as controller 356.

Figure 5:
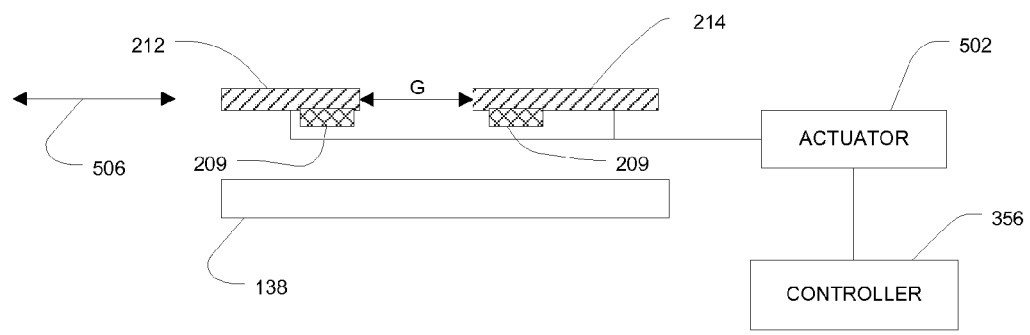
FIG. 5 is a block diagram of a system to control a horizontal spacing between a pair of modifiers.

Turning to FIG. 5, a block diagram of another embodiment consistent with the present disclosure is illustrated where the horizontal spacing (G) between modifiers 212 and 214 may be adjusted. The horizontal spacing adjustments may in lieu of, or in addition to, the earlier detailed vertical spacing adjustments of FIG. 4. An actuator 502 may be mechanically coupled to at least one of the pair of modifiers 212 and 214 to drive the modifiers in the direction shown by the arrow 506 relative to one another. The actuator 502 may be controlled by a controller such as controller 356.

Figure 6:
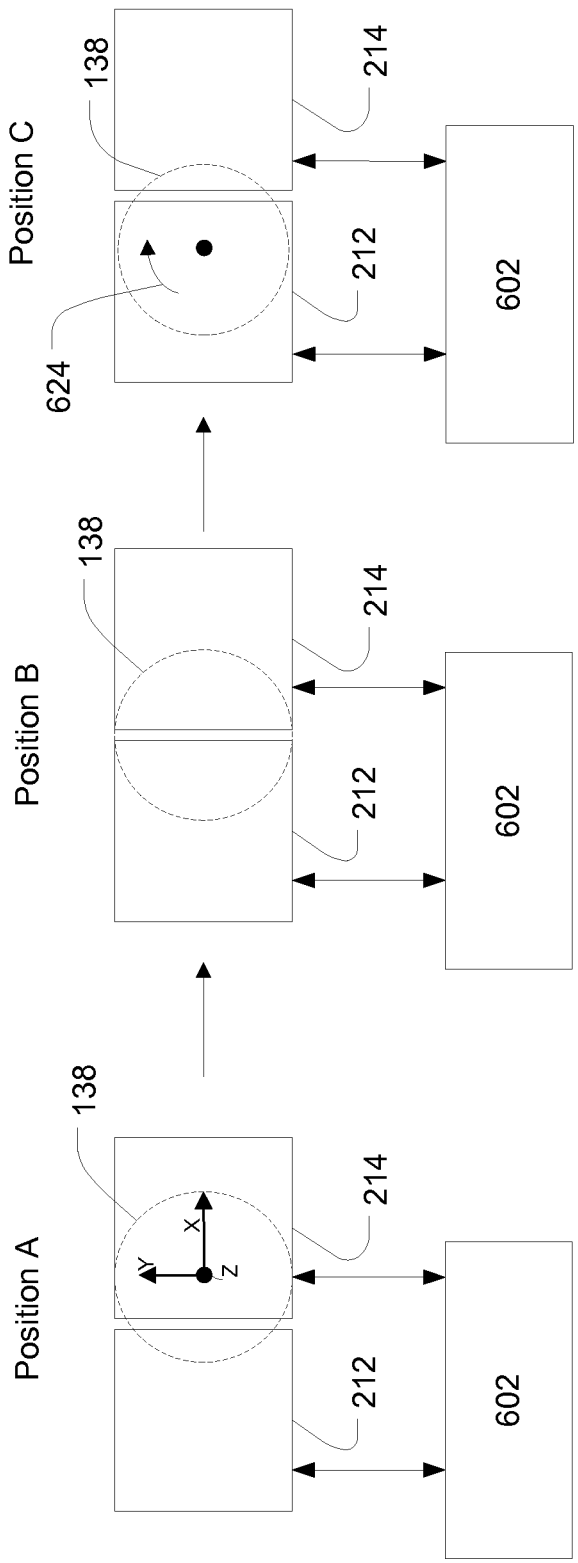
FIG. 6 shows relative movement between the modifier sheets and a disk shaped workpiece.

As shown in FIG. 6, in some embodiments, the plasma processing apparatus 200 may have a scanning system 602 to drive a plasma sheath modifier relative the workpiece 138. The scanning system 602 may include an actuator mechanically coupled to the modifiers 212 and 214 to drive the same. This actuator (not shown) may be controlled by a controller, such as controller 356 (See FIG. 3). In the embodiment of FIG. 6, the scanning system 602 may drive the modifiers 212 and 214 from Position A, to Position B, and Position C, etc. so that all portions of the workpiece 138 are exposed to the gap defined by the pair of modifiers 212 and 214. If a Cartesian coordinate system is defined as detailed in FIG. 6, the modifiers 212 and 214 are driven in the X direction of FIG. 6. In other embodiments, the modifiers 212 and 214 or another set of different modifiers may be driven in the Y direction or any angle between the X and Y directions. In addition, the workpiece 138 may be rotated as the scanning system 602 drives the modifiers 212 and 214 in one direction. The workpiece 138 may also be rotated by a predetermined rotation angle after the scanning system 602 drives the modifiers 212 and 214 in one direction. In one example, the rotation may be about a central axis of the workpiece as illustrated by arrow 624.

Figure 10:
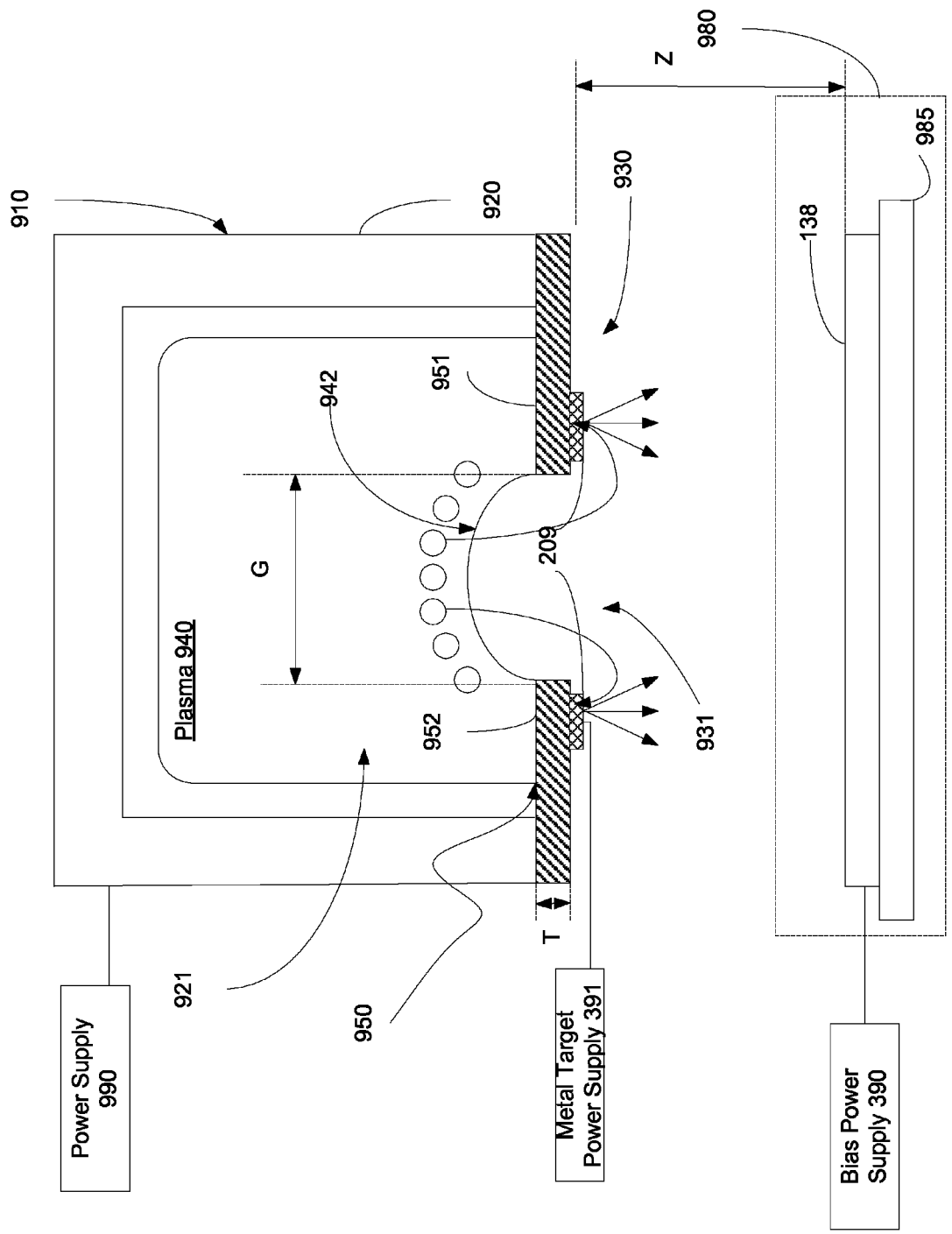
FIG. 10 is a block diagram of a plasma doping apparatus consistent with an embodiment of the disclosure.

FIG. 10 shows another embodiment of ion implanter that may be used in accordance with an embodiment. The ion source 910 includes a chamber 921 having sidewalls 920 and an open end 930. Plasma 940 is generated within the chamber 921. Plasma can be generated using any suitable means, including indirectly heated cathode (IHC), RF energy or other means. In the chamber 921, disposed near the open end 930 are one or more plasma sheath modifiers 950. The plasma sheath modifiers 950 are configured to have an extraction aperture 931. The plasma sheath modifiers 950 are used to control a shape of the boundary 942 between the plasma 940 and the plasma sheath proximate the extraction aperture 931 when ions are extracted from the chamber 921 of the ion source 910. The plasma sheath modifier 950 may include a pair of modifiers 951, 952 defining a gap there between. Other embodiments may have multiple pairs of modifiers defining multiple gaps.

The modifiers 951, 952 may be fabricated of semiconductor materials, including, but not limited to, silicon, germanium, silicon carbide, silicon germanium, aluminum antimonide, aluminum nitride, and gallium arsenide. The modifiers 951, 952 may also be fabricated of doped semiconductor materials including, for example, doped silicon and doped silicon carbide. To form the doped silicon carbide, silicon carbide may be doped with species such as nitrogen, boron, and aluminum to name only several dopants.

The pair of modifiers 951, 952 may also be a pair of sheets having a thin, flat shape. The pair of modifiers 951, 952 defines a gap there between having spacing (G). The pair of semiconductors 951, 952 may also be positioned a vertical spacing (Z) above the workpiece 138.

Depending on a number of factors including, but not limited to, the horizontal spacing (G) between the pair of modifiers 951, 952, the vertical spacing (Z) of the modifiers above the workpiece 138, a difference in vertical spacing between each modifier 951, 952 above the workpiece 138, the modifiers material including its relative conductivity, the thickness (T) of the modifiers 951, 952, the temperature of the pair of modifiers 951, 952, and other process parameters of the ion source, the shape of the boundary 942 can be controlled.

Metal targets 209 are disposed proximate the side of the modifiers 951, 952 closest to the workpiece 138. As described above, the metal targets 209 may be biased by metal target power supply 391.

The ion source 910 may be a component of an ion implanter having an end station 980 positioned downstream of the extraction aperture 931 of the ion source 910. The end station 980 may be positioned in close proximity (e.g., in one embodiment less than 12 inches) to the extraction aperture 931 of the ion source 910 thereby creating a relatively short distance for the particles to travel. The end station 980 may include a platen 985 to support a workpiece 138. The platen 985 may be an electrostatic platen to secure the workpiece 138 with electrostatic forces as is known in the art. The workpiece 138 may include, but not be limited to, a solar cell, flat panel, magnetic media, semiconductor wafer, etc.

In some embodiments, the metal targets 209 may be biased by a metal target power supply 391 to create forces to extract the ions from the extraction aperture 931 toward the metal targets 209. The workpiece 138 may also be biased by a bias power supply 390. The bias signal to the workpiece 138 may be a pulsed bias signal having ON and OFF time interval so that particles are attracted during the ON intervals but not the OFF intervals. Similarly, the bias signal to the metal targets 209 may be a pulsed bias signal. One reason for a pulsed bias signal is to control the amount of charge accumulation on the workpiece 138 to acceptable levels during ion treatment, while trying to balance charge control with throughput requirements for an associated ion implanter. In this embodiment, the interaction between metal target power supply 391 and bias power supply 390 may be as described in FIG. 9.

In another embodiment, a power supply 990 is used to bias the sidewalls 920 of the ion source 910. The workpiece 138 may also be biased, such as by a bias power supply 390, and the metal targets 209 may be biased by a metal target power supply 391. In this embodiment, the sidewalls 920 of the ion source may be positively biased, such as at about 2 kV. In this embodiment, the metal targets 209 may be grounded, so as to attract positive ions from within the chamber 921 toward the metal targets 209. The workpiece 138 may be less negatively biased than the metal targets 209, such as at 1 kV, so that ions are primarily attracted to the metal targets 209. As described above, the power supplies, such as power supply 990, metal target power supply 391 and bias power supply 390 may be pulsed and synchronized with each other to optimize the deposition of particles on the workpiece 138.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma processing apparatus comprising:
 a process chamber;
 a platen positioned in the process chamber for supporting a workpiece;
 a source configured to generate a plasma in the process chamber having a plasma sheath proximate a front surface of the workpiece;
 an insulating plasma sheath modifier, having a gap, disposed between the plasma and the platen, such that a first surface of the insulating plasma sheath modifier is proximate the plasma and a second surface is closer to the platen, and configured to control a shape of a boundary between the plasma and the plasma sheath so a portion of the shape of the boundary is not parallel to a plane defined by a front surface of the workpiece facing the plasma; and
 a metal target, affixed to the second surface of the insulating plasma sheath modifier closer to the platen,
 wherein ions in the plasma are attracted across the boundary through the gap and strike the metal target at a plurality of incident angles.

2. The plasma processing apparatus of claim 1, further comprising a power supply configured to bias the metal target to attract ions from the plasma across the plasma sheath toward the metal target so as to cause metal particles to sputter from the metal target.

3. The plasma processing apparatus of claim 2, further comprising a bias source configured to bias the workpiece to attract the metal particles towards the workpiece for depositing metal on the workpiece, wherein a range of incident angles of the metal particles relative to the plane is influenced by the shape of the boundary between the plasma and the plasma sheath.

4. The plasma processing apparatus of claim 3, wherein the workpiece is less negatively biased than the metal target.

5. The plasma processing apparatus of claim 2, wherein the power supply supplies a pulsed bias signal to the metal target.

6. The plasma processing apparatus of claim 3, wherein the bias source supplies a pulsed bias signal to the workpiece.

7. The plasma processing apparatus of claim 3, wherein the power supply supplies a first pulsed bias signal to the metal target and the bias source supplies a second pulsed bias signal to the workpiece, wherein the first pulsed bias signal and the second pulsed bias signal are coordinated to optimize sputtering of metal particles onto the workpiece.

8. The plasma processing apparatus of claim 1, wherein the metal target is shaped such that a surface of the metal target closest to the workpiece is not parallel to the front surface of the workpiece.

9. A sputtering system, comprising:
 a chamber having sidewalls and an open end, and configured to generate a plasma having a plasma sheath;
 an insulating plasma sheath modifier disposed near the open end of the chamber, such that a first surface of the insulating plasma sheath modifier is proximate the plasma and a second surface is distal from the chamber, the insulating plasma sheath modifier configured to have an extraction aperture and configured to control a shape of a boundary between the plasma and the plasma sheath so a portion of the shape of the boundary is not parallel to a plane defined by a front surface of the workpiece facing the plasma; and
 a metal target affixed to the second surface of the insulating plasma sheath modifier distal from the chamber,
 wherein ions in the plasma are attracted across the boundary through the extraction aperture and strike the metal target at a plurality of incident angles.

10. The sputtering system of claim 9, further comprising a platen, configured to hold a workpiece, the platen located such that the metal target is disposed between the chamber and the platen.

11. The sputtering system of claim 10, comprising a bias supply configured to bias the workpiece to attract metal particles from the metal target towards the workpiece for depositing metal on the workpiece, wherein a range of incident angles of the metal particles relative to the workpiece is influenced by the shape of the boundary between the plasma and the plasma sheath.

12. The sputtering system of claim 11, further comprising a power supply to positively bias the sidewalls relative to the metal target.

13. The sputtering system of claim 12, wherein the workpiece is more positively biased than the metal target.

14. The sputtering system of claim 12, wherein the power supply supplies a pulsed bias signal to the sidewalls.

15. The sputtering system of claim 14, wherein the bias supply supplies a second pulsed bias signal to the workpiece, and the pulsed bias signal and the second pulsed bias signal are coordinated so as to optimize sputtering of metal particles on the workpiece.

16. The sputtering system of claim 11, comprising a power supply configured to negatively bias the metal target relative to the sidewalls so as to attract ions from the plasma across the plasma sheath toward the metal target so as to cause the metal particles to sputter from the metal target.

17. The sputtering system of claim 16, wherein the workpiece is more positively biased than the metal target.

18. The sputtering system of claim 16, wherein the power supply supplies a pulsed bias signal to the metal target.

19. The sputtering system of claim 18, wherein the bias supply supplies a second pulsed bias signal to the workpiece, and the pulsed bias signal and the second pulsed bias signal are coordinated so as to optimize sputtering of metal particles on the workpiece.

20. The sputtering system of claim 9, wherein the metal target is shaped such that a surface of the metal target closest to the workpiece is not parallel to the front surface of the workpiece.

\* \* \* \* \*